United States Patent
Cha et al.

(10) Patent No.: US 8,421,497 B2
(45) Date of Patent: Apr. 16, 2013

(54) SEMICONDUCTOR CHIP AND SEMICONDUCTOR MODULE INCLUDING THE SEMICONDUCTOR CHIP

(75) Inventors: Seung-yong Cha, Hwaseong-si (KR); Sun-won Kang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/018,856

(22) Filed: Feb. 1, 2011

(65) Prior Publication Data

US 2011/0187406 A1 Aug. 4, 2011

(30) Foreign Application Priority Data

Feb. 2, 2010 (KR) .................. 10-2010-0009641

(51) Int. Cl.
 *H03K 17/16* (2006.01)
 *H03K 19/0003* (2006.01)

(52) U.S. Cl.
 USPC .......................................................... 326/30

(58) Field of Classification Search ........................ None
 See application file for complete search history.

(56) References Cited

U.S. PATENT DOCUMENTS

| | | | | |
|---|---|---|---|---|
| 6,762,620 B2 * | 7/2004 | Jang et al. | ......................... | 326/30 |
| 6,876,072 B1 * | 4/2005 | Wang et al. | ................... | 257/678 |
| 7,148,721 B2 * | 12/2006 | Park | ............................... | 326/30 |
| 7,196,540 B2 * | 3/2007 | Ueno | .............................. | 326/30 |
| 7,233,061 B1 * | 6/2007 | Conn | ........................... | 257/686 |
| 7,521,957 B2 * | 4/2009 | Koo | ................................ | 326/30 |
| 7,688,105 B2 * | 3/2010 | Wong | ............................. | 326/30 |
| 7,986,161 B2 * | 7/2011 | Lee et al. | ........................ | 326/30 |
| 2010/0084753 A1 * | 4/2010 | Park | ............................. | 257/686 |

FOREIGN PATENT DOCUMENTS

| | | |
|---|---|---|
| JP | 2003086683 A | 3/2003 |
| JP | 2003282788 A | 10/2003 |
| JP | 2007027307 A | 2/2007 |
| KR | 20050044326 A | 5/2005 |

* cited by examiner

*Primary Examiner* — Crystal L Hammond
(74) *Attorney, Agent, or Firm* — Harness, Dickey & Pierce, P.L.C.

(57) ABSTRACT

A semiconductor chip including a termination resistance and a semiconductor module including the semiconductor chip. The semiconductor chip comprising a plurality of memory cells, the semiconductor chip including: at least one first center pads disposed on a center region of the semiconductor chip and connected to the plurality of memory cells; at least one first edge pads disposed on an edge region of the semiconductor chip and connected to a first transmission line of a semiconductor module; at least one second edge pads disposed on the edge region of the semiconductor chip and connected to a chipset voltage application unit of the semiconductor module; at least one first redistribution patterns connected between the at least one first center pads and the at least one first edge pads; and at least one second redistribution patterns connected between the at least one first edge pads and the at least one second edge pads, wherein an impedance of the at least one second redistribution patterns is impedance matched to an impedance of the first transmission line.

16 Claims, 6 Drawing Sheets

SEMICONDUCTOR CHIP AND SEMICONDUCTOR MODULE INCLUDING THE SEMICONDUCTOR CHIP

CROSS-REFERENCE TO RELATED APPLICATIONS

This application claims priority under 35 U.S.C. §119 to Korean Patent Application No. 10-2010-0009641, filed on Feb. 2, 2010, in the Korean Intellectual Property Office (KIPO), the entire contents of which is incorporated herein in by reference.

BACKGROUND

Example embodiments relate to a semiconductor chip and a semiconductor module including the same, and more particularly to, a semiconductor chip including a termination resistance and a semiconductor module including the semiconductor chip.

Termination resistance is placed at the end of a transmission line and absorbs a signal to prevent the signal from being reflected back from the end. As an operating speed of a memory semiconductor device such as dynamic random access memory (DRAM) increases, termination resistance is realized to prevent a data signal and a control signal from being reflected and stably transmit the data signal and the control signal.

SUMMARY

The example embodiments provide a semiconductor chip with electrical characteristics improved and a semiconductor module including the semiconductor chip.

According to an aspect of the example embodiments, there is provided a semiconductor chip including a plurality of memory cells, the semiconductor chip including: at least one first center pads disposed on a center region of the semiconductor chip and connected to the plurality of memory cells; at least one first edge pads disposed on an edge region of the semiconductor chip and connected to a first transmission line of a semiconductor module; at least one second edge pads disposed on the edge region of the semiconductor chip and connected to a chipset voltage application unit of the semiconductor module; at least one first redistribution patterns connected between the at least one first center pads and the at least one first edge pads; and at least one second redistribution patterns connected between the at least one first edge pads and the at least one second edge pads, wherein an impedance of the at least one second redistribution patterns is impedance matched to an impedance of the first transmission line.

The at least one second redistribution patterns may perform a function of a parallel termination resistance that prevents a signal transmitted through the first transmission line from being reflected.

The at least one first redistribution patterns may extend in a first direction, and the at least one second redistribution patterns may extend in a second direction in perpendicular to the first direction.

An impedance of the at least one second redistribution patterns may be greater than an impedance of the at least one first redistribution patterns.

The semiconductor chip may further include: at least one second center pads disposed on the center region of the semiconductor chip and connected to the plurality of memory cells; at least one third edge pads disposed on the edge region of the semiconductor chip and connected to a second transmission line; and at least one third redistribution patterns connected between the at least one second center pads and the at least one third edge pads.

An impedance of the at least one third redistribution patterns may be impedance matched to a difference between an impedance of the second transmission line and impedances from the at least one second center pads to the plurality of memory cells.

The first transmission line may transmit a command signal, an address signal, or a clock signal, and the second transmission line may transmit a data signal.

The at least one first redistribution patterns, the at least one second redistribution patterns, and the at least one third redistribution patterns may be formed on a region between the edge region and the center region.

At least one selected from the group consisting of the at least one first redistribution patterns, the at least one second redistribution patterns, and the at least one third redistribution patterns may include a meander member.

At least one selected from the group consisting of the at least one second redistribution patterns and the at least one third redistribution patterns may include a plurality of redistribution patterns that are connected in parallel to each other, wherein the semiconductor chip further includes a metal fuse connected to each of the at least one second redistribution patterns and the at least one third redistribution patterns.

The metal fuse may be in the form of a line, and include a fuse blowing unit between both ends of the line, wherein both ends of the lines includes an impurity ion.

The impedance of the at least one second redistribution patterns may be greater than an impedance of the at least one third redistribution patterns.

A length of the at least one second redistribution patterns may be greater than a length of the at least one third redistribution patterns.

A resistivity of the at least one second redistribution patterns may be greater than a resistivity of the at least one third redistribution patterns.

According to another aspect of the example embodiments, there is provided a semiconductor module including a plurality of semiconductor chips including a plurality of memory cells, the semiconductor module including: a substrate on which the plurality of semiconductor chips are mounted; a chipset voltage application unit mounted on the substrate; and a first transmission line faulted on the substrate and transmitting a command signal, an address signal, or a clock signal to each of the plurality of semiconductor chips, wherein at least one of the plurality of semiconductor chips includes: at least one first center pads disposed on a center region of the at least one semiconductor chip and connected to the plurality of memory cells; at least one first edge pads disposed on an edge region of the at least one semiconductor chip and connected to a first transmission line of a semiconductor module; at least one second edge pads disposed on the edge region of the semiconductor chip and connected to a chipset voltage application unit of the semiconductor module; at least one first redistribution patterns connected between the at least one first center pads and the at least one first edge pads; and at least one second redistribution patterns connected between the at least one first edge pads and the at least one second edge pads.

The first transmission line may include: a first wire line for connecting an external terminal of the substrate and the at least one first edge pads of the at least one semiconductor chip; and a plurality of second wire lines for connecting the first edge pads of the plurality of semiconductor chips, wherein the first wire line and the plurality of second wire lines have the substantially same impedance, and the impedance of the plurality of second wire lines is impedance matched to an impedance of the first wire line.

The semiconductor module may further include: a plurality of second transmission lines formed on the substrate and transmitting a data signal to each of the plurality of semiconductor chips, wherein at least one of the plurality of semiconductor chips includes: at least one second center pads disposed on the center region of the at least one semiconductor chip and connected to the plurality of memory cells; at least one third edge pads disposed on the edge region of the at least one semiconductor chip and connected to a second transmission line; and at least one third redistribution patterns connected between the at least one second center pads and the at least one third edge pads.

The plurality of second transmission lines may include a third wire line that connects the third edge pads of the plurality of semiconductor chips and the external terminal of the substrate, an impedance of the at least one third redistribution patterns is impedance matched to a difference between an impedance of the third wire line and impedances from the second center pads to the plurality of memory cells.

The at least one first redistribution patterns and the at least one third redistribution patterns may extend in a first direction, and the at least one second redistribution patterns may extend in a second direction in perpendicular to the first direction.

According to another aspect of the example embodiments, there is provided a semiconductor chip including a plurality of memory cells, the semiconductor chip including: at least one center pads disposed on a center region of the semiconductor chip and connected to the plurality of memory cells; at least one edge pads disposed on an edge region of the semiconductor chip and connected to a transmission line; and at least one redistribution patterns connected between the at least one center pads and the at least one edge pads, wherein an impedance of the at least one redistribution patterns is impedance matched to a difference between an impedance of the transmission line and impedances from the at least one center pads and the plurality of memory cells, so that the at least one redistribution patterns perform a function of a serial termination resistance that prevents a signal transmitted through the data transmission line from being reflected.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, example embodiments of the invention should not be construed as limited to the particular shapes of regions illustrated herein but are to include deviations in shapes that result, for example, from manufacturing.

Figure 1:
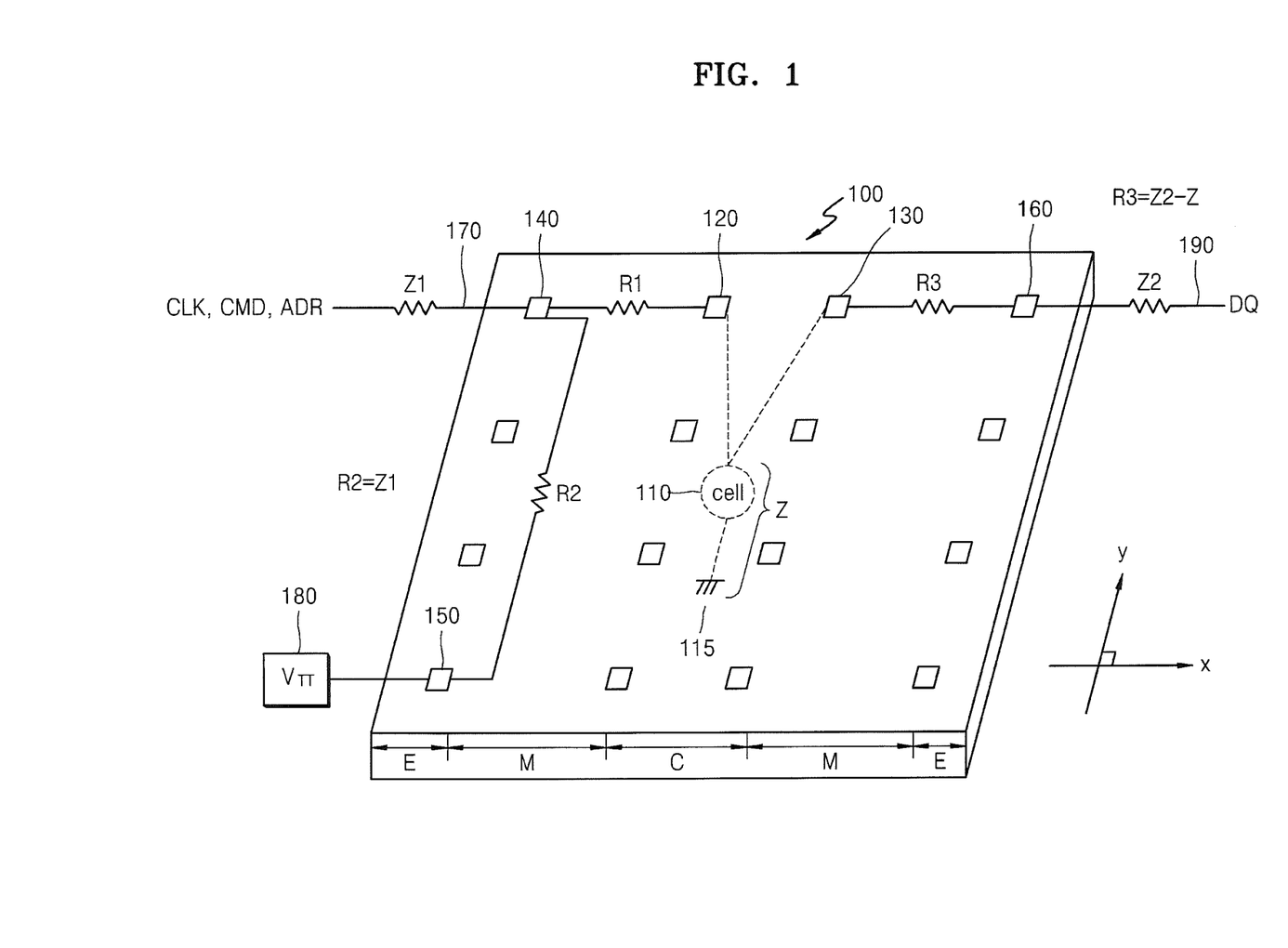
FIG. 1 is a schematic perspective view of a semiconductor chip according to an example embodiment.
Figure 2:
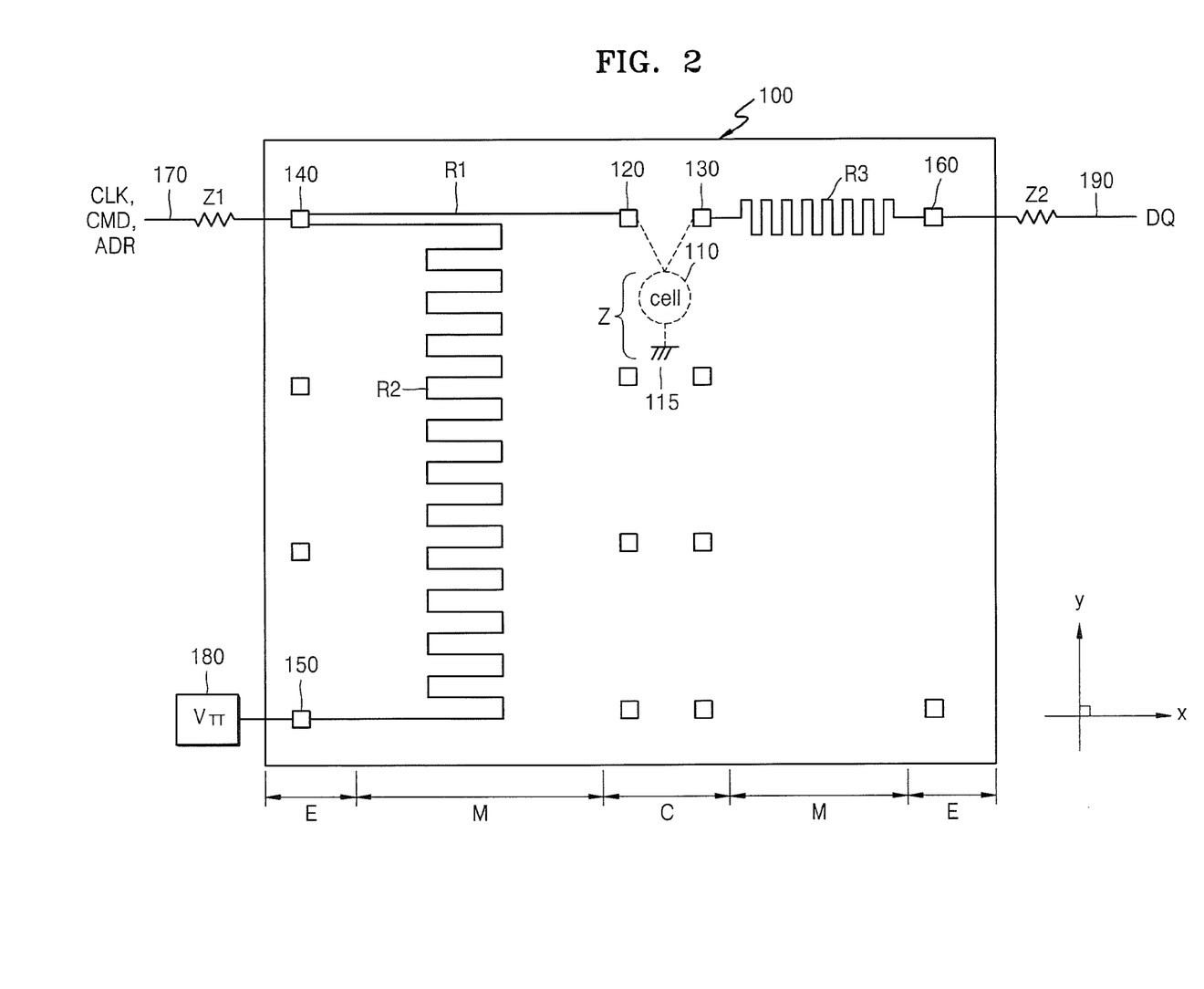
FIG. 2 is a schematic cross-sectional view of a semiconductor chip according to an example embodiment.

FIGS. 1 and 2 are schematic perspective and cross-sectional views of a semiconductor chip 100, respectively, according to an example embodiment.

Referring to FIGS. 1 and 2, the semiconductor chip 100 includes a plurality of memory cells 110, a first center pad 120, a second center pad 130, a first edge pad 140, a second edge pad 150, a third edge pad 160, a first redistribution pattern R1, a second redistribution pattern R2, and a third redistribution pattern R3. The first, second and third redistribution patterns R1-R3 may be, for example, elements configured to provide a reference resistance or impedance.

The first center pad 120 and the second center pad 130 may be disposed on a center region C of the semiconductor chip 100 and may be electrically connected to the memory cells 110. More specifically, the first center pad 120 may be word lines (not shown) of the memory cells 110, and the second center pad 130 may be bit lines (not shown) of the memory cells 110. The memory cells 110 may be connected to a ground 115.

The first edge pad 140, the second edge pad 150, and the third edge pad 160 may be disposed on an edge region E of the semiconductor chip 100. More specifically, the first edge pad 140 may be connected to a first transmission line 170 that transmits a command signal CMD, an address signal ADR, or a clock signal CLK. The second edge pad 150 may be connected to a chipset voltage application unit 180. The third edge pad 160 may be connected to a second transmission line 190 that transmits a data signal DQ.

The first redistribution pattern R1 may be connected between the first center pad 120 and the first edge pad 140. The first redistribution pattern R1 may be faulted extending in a first direction X which may be, for example, a horizontal direction.

The second redistribution pattern R2 may be connected between the first edge pad 140 and the second edge pad 150. The second redistribution pattern R2 may be formed extending in a second direction Y which may be, for example, a vertical direction in perpendicular to the first direction X. An impedance of the second redistribution pattern R2 may be greater than an impedance of the first redistribution pattern R1. The impedance of the second redistribution pattern R2 may be impedance matched to an impedance Z1 of the first transmission line 170. Such an impedance matching may enable the second redistribution pattern R2 to perform a function of a parallel termination resistance that prevents the command signal CMD, the address signal ADR, or the clock signal CLK transmitted from the first transmission line 170 from being reflected.

The third redistribution pattern R3 may be connected between the second center pad 130 and the third edge pad 160. The third redistribution pattern R3 may be formed extending in the first direction X. An impedance of the third redistribution pattern R3 may be impedance matched to a difference between an impedance Z2 of the second transmission line 190 and an impedance Z from the second center pad 130 to the memory cells 110, i.e. Z2-Z. Such an impedance matching may enable the third redistribution pattern R3 to perform a function of a serial termination resistance that prevents the data signal transmitted from the second transmission line 190 from being reflected.

The impedance of the third redistribution pattern R3 may be smaller than the impedance of the second redistribution pattern R2. A length and resistivity of the second redistribution pattern R2 may be adjusted in such a way that the impedance of the second redistribution pattern R2 is greater than the impedance of the third redistribution pattern R3. For example, the length of the second redistribution pattern R2 may be longer than the length of the third redistribution pattern R3, and the resistivity of the second redistribution pattern R2 may be greater than the resistivity of the third redistribution pattern R3.

The first through third redistribution patterns R1, R2, and R3 may be formed on a region M of the semiconductor chip 100 between the edge region E and the center region C. At least one of the first through third redistribution patterns R1, R2, and R3 may include a meander member. Although the first through third redistribution patterns R1, R2, and R3 are in the faun of a meander, example embodiments are not limited thereto, and the first through third redistribution patterns R1, R2, and R3 may also use other metal patterns including, for example, a single loop, a saw tooth, or a spiral.

Figure 3:
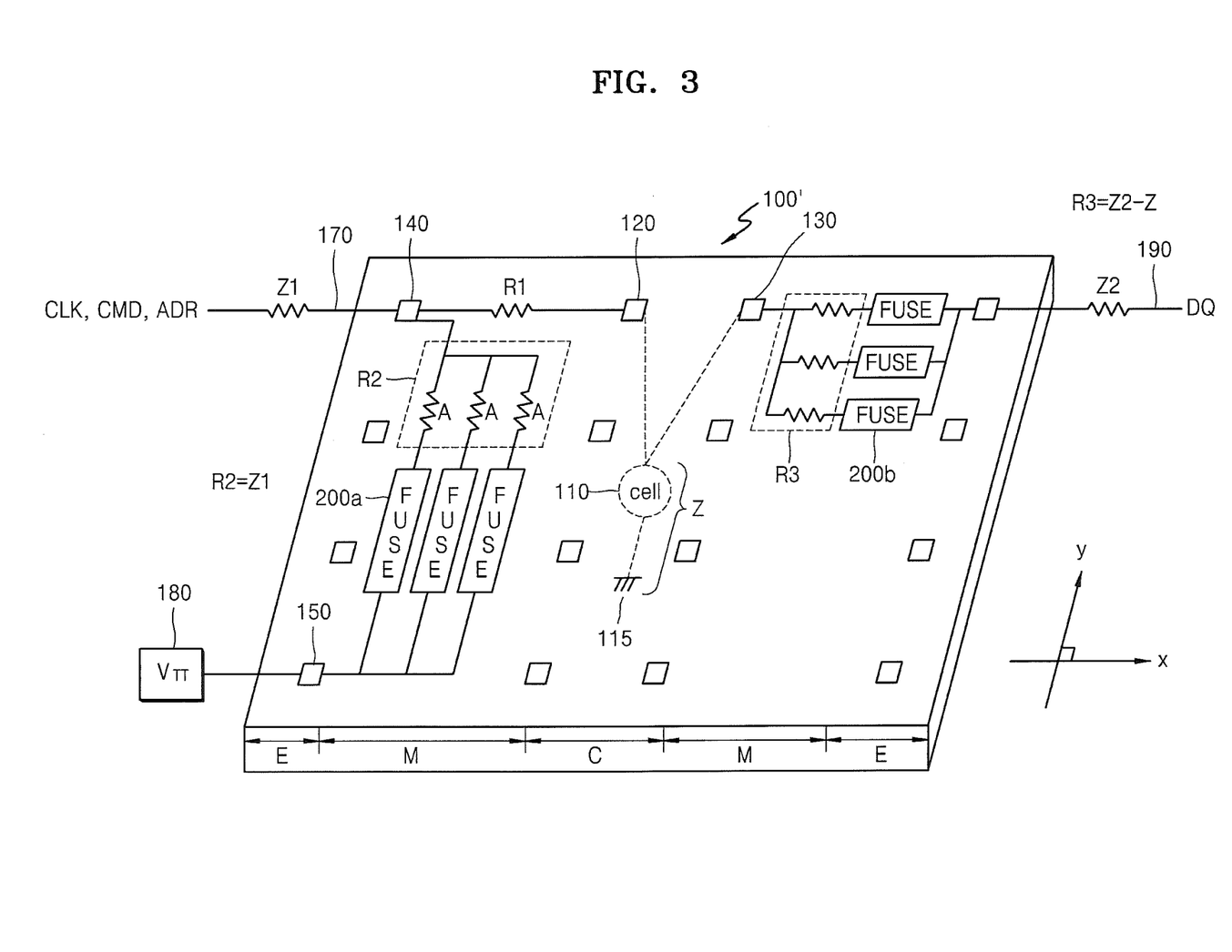
FIG. 3 is a schematic perspective view of a semiconductor chip according to another example embodiment.
Figure 4:
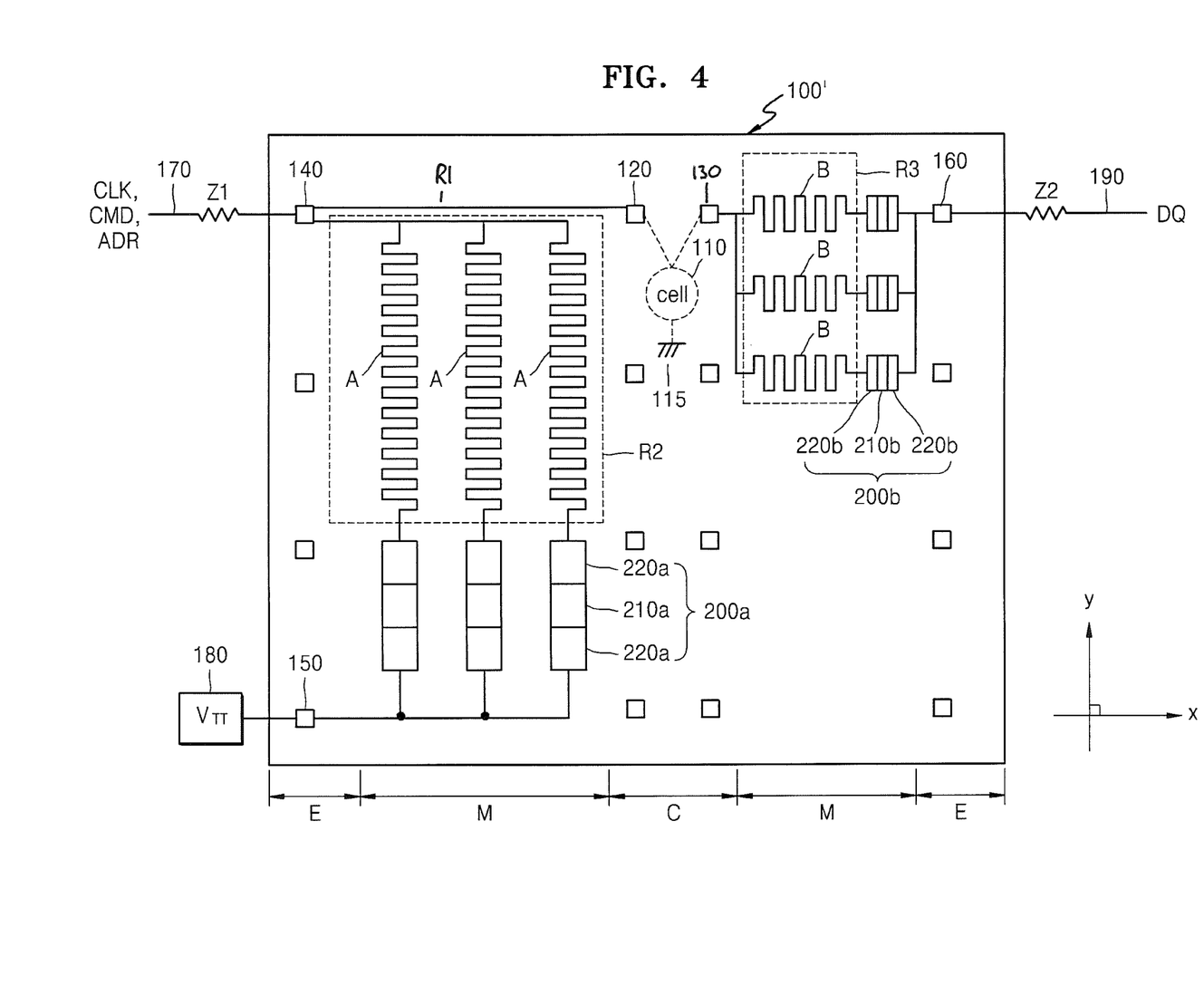
FIG. 4 is a schematic cross-sectional view of a semiconductor chip according to another example embodiment.

FIGS. 3 and 4 are schematic perspective and cross-sectional views of a semiconductor chip 100', respectively, according to an example embodiment. The semiconductor chip 100' may be a modification of the semiconductor chip 100 described with reference to FIGS. 1 and 2. Thus, the redundant description thereof will not be repeated here.

Referring to FIGS. 3 and 4, the second redistribution pattern R2 and the third redistribution pattern R3 may include a plurality of redistribution patterns A and B that are connected in parallel to each other. For example, the second redistribution pattern R2 may include three redistribution patterns A. Likewise, the third redistribution pattern R3 may include three redistribution patterns B. Each of the redistribution patterns A and B may include meander members.

The semiconductor chip 100' may further include first metal fuses 200a and second metal fuses 200b that include a fuse blowing unit 210. The first metal fuses 200a and second metal fuses 200b may be connected to the redistribution patterns A and B, respectively. Fuse blowing units 210a and 210b of the first and second metal fuses 200a and 200b may be cut through a laser blowing process. More specifically, during the laser blowing process, energy is applied to the fuse blowing units 210a and 210b, heat generated by the energy is condensed, and the fuse blowing units 210a and 210b are evaporated, and thus the fuse blowing units 210a and 210b may be cut. Therefore, the laser blowing process may remove an electrical connection in the fuse blowing units 210a and 21013.

The first metal fuses 200a and the second metal fuses 200b may be in the form of lines. The fuse blowing units 210a and 210b may be located between both ends 220a and 220b of the first metal fuses 200a and the second metal fuses 200b. Impurity ions, such as oxygen, nitrogen, or boron ions, may be injected into both ends 220a and 220b of the first metal fuses 200a and the second metal fuses 200b through an impurity ion injection process. When the impurity ions are injected into both ends 220a and 220b of the first metal fuses 200a and the second metal fuses 200b, electrical and thermal conductivities of both ends 220a and 220b are reduced so that heat may be sufficiently condensed in the fuse blowing units 210a and 210b during the laser blowing process. That is, heat condense efficiency of the fuse blowing units 210a and 210b is improved, which enables efficient cutting of the fuse blowing units 210a and 210b.

The first metal fuses 200a and the second metal fuses 200b connected to the redistribution patterns A and B, respectively, may be cut through the laser blowing process, thereby changing the impedances of the second redistribution pattern R2 and the third redistribution pattern R3.

For example, when the redistribution patterns A are connected to the first metal fuses 200a, since three meander members of the redistribution patterns A are connected in parallel to each other, the second redistribution pattern R2 has an impedance of ⅓ the impedance of a redistribution pattern A. Meanwhile, when one of the redistribution patterns A connected to the first metal fuses 200a is removed through the laser blowing process, the second redistribution pattern R2 has an impedance of ½ the impedance of a redistribution pattern A, and when two of the redistribution patterns A connected to the first metal fuses 200a are removed through the laser blowing process, the second redistribution pattern R2 has an impedance equal to the impedance of a redistribution pattern A.

Likewise, at least one of the redistribution patterns B connected in parallel to the second metal fuses 200b may be removed through the laser blowing process. Therefore, the impedance of the third redistribution pattern R3 may vary like 1, ½, and ⅓ times the impedance of a redistribution pattern B.

The first metal fuses 200a are cut through the laser blowing process, thereby varying the impedance of the second redistribution pattern R2 and determining a termination resistance of the second redistribution pattern R2 that is impedance matched to the impedance Z1 of the first transmission line 170.

Likewise, the second metal fuses 200b are cut through the laser blowing process, thereby varying the impedance of the third redistribution pattern R3, and determining a termination resistance of the third redistribution pattern R3 that is impedance matched to a difference between the impedance Z2 of the second transmission line 190 and the impedance Z from the second center pad 130 to the memory cells 110, i.e. Z2-Z.

Although the impedances of the redistribution patterns A and B are the same in the present embodiment, example embodiments are not limited thereto, and lengths or resistivities of the redistribution patterns A and B may be adjusted in such a way that the impedances of the redistribution patterns A and B are different from each other.

Figure 5:
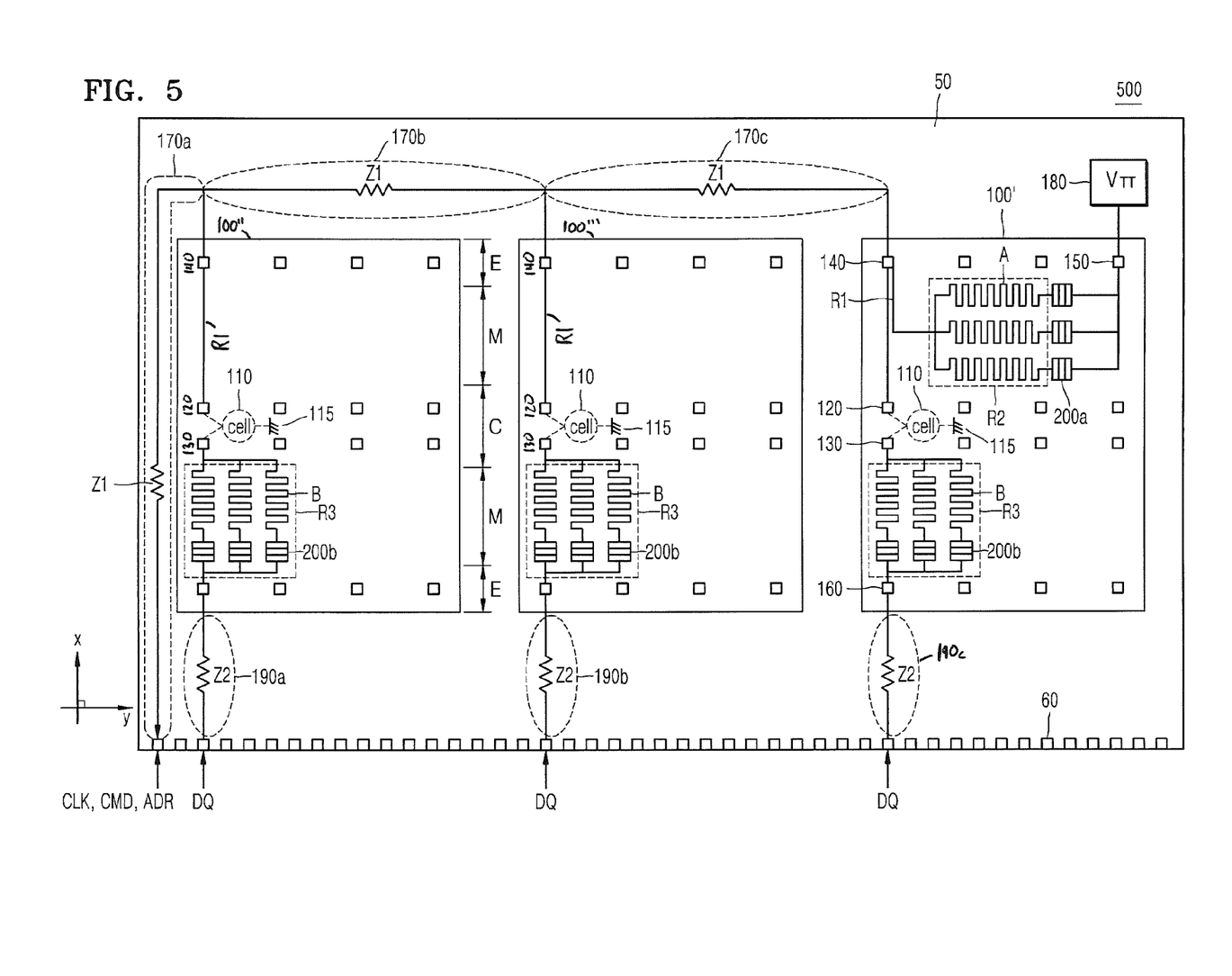
FIG. 5 is a schematic cross-sectional view of a semiconductor module according to an example embodiment.

FIG. 5 is a schematic cross-sectional view of a semiconductor module 500 according to an example embodiment. The semiconductor module 500 of the present embodiment is formed by mounting a first semiconductor chip 100', which is the same as the semiconductor chip 100' of FIG. 2, and second and third semiconductor chips 100" and 100''' on a substrate 50. The second and third semiconductor chips 100" and 100''' have all the components of the first semiconductor chip 100' except the second redistribution pattern R2 and first metal fuses 200a.

Referring to FIG. 5, the semiconductor module 500 may include the substrate 50, the first through third semiconductor chips 100', 100" and 100''' each including the memory cells 110, the chipset voltage application unit 180, first transmission lines 170a, 170b, and 170c, and second transmission lines 190a, 190b, and 190c. As described above, the first through third semiconductor chips 100', 100" and 100''' may include the first and second center pads 120 and 130, the first through third edge pads 140, 150, and 160, first and third redistribution patterns R1 and R3, and the metal fuses 200b. The first semiconductor chip 100' may additionally include the redistribution pattern R2 and the metal fuse 200a.

The semiconductor chips 100', 100" and 100''' may be mounted on the substrate 50. The substrate 50 may be a single-surface, both-surface, or multi-layer printed circuit substrate (PCB). The substrate 50 may be realized as a flexible PCB.

The chipset voltage application unit 180 may be mounted on the substrate 50 and may apply a chipset voltage Vtt to the second edge pad 150 of the semiconductor chip 100'. More specifically, the chipset voltage application unit 180 may be a wire line (not shown) formed on the substrate 50, and may transfer the chip voltage Vtt that is applied from a main board (not shown) connected to an external terminal 60 to the second edge pad 150 of the semiconductor chip 100'.

The first transmission lines 170a, 170b, and 170c may be mounted on the substrate 50 and transmit the command signal CLK, the address signal CMD, or the clock signal ADR to the first edge pad 140 of the semiconductor chips 100', 100" and 100'''. More specifically, the first transmission lines 170a, 170b, and 170c may be wire lines formed on the substrate 50, and may include the first wire lines 170a that connect the external terminal 60 of the substrate 50 and the first edge pad 140 of the second semiconductor chip 100" and the second wire lines 170b and 170c between the first edge pads 140 of the third semiconductor chips 100''' and the first semiconductor chip 100'. Impedances of the first wire line 170a and the second wire lines 170b and 170c may be substantially same.

The second transmission lines 190a, 190b, and 190c may be mounted on the substrate 50, and transmit the data signal DQ to the third edge pads 160 of the first through third semiconductor chips 100', 100" and 100'''. More specifically, the second transmission lines 190a, 190b, and 190c may be wire lines formed on the substrate 50, and may include the third wire lines 190c, 190b, and 190a that connect the third edge pads 160 of the first through third semiconductor chips 100', 100" and 100''', respectively, and the external terminal 60 of the memory module 500.

The second redistribution pattern R2 and the third redistribution pattern R3 perform a function of a termination resistance in order to prevent the signals CLK, CMD, ADR, and DQ that are applied to the memory chip 100' from being reflected. For example, the impedance of the second redistribution pattern R2 may be impedance matched to the impedance Z1 of the first wire line 170a that connects the external terminal 60 of the substrate 50 and the first edge pad 140 of the second semiconductor chip 100". In this case, the second redistribution pattern R2 performs a function of a parallel termination resistance. When the first wire line 170a and the second wire lines 170b and 170c have the same impedance, the impedance of the second redistribution pattern R2 may be impedance matched to the impedances Z1 of the second redistribution lines 170b and 170c that connect the first edge pads 140 of the first through third semiconductor chips 100', 100" and 100'''.

Further, for example, the impedance of the third redistribution pattern R3 may be impedance matched to a difference between the impedance Z2 of the third wire lines 190a, 190b, and 190c that connect the third edge pads 160 of the first through third semiconductor chips 100', 100" and 100''' and the external terminal 60 of the substrate 50 and the impedance Z from the second center pad 130 to the memory cells 110, i.e. Z2-Z. In this case, the third redistribution pattern R3 performs a function of a serial termination resistance.

As described above, the first through third redistribution patterns R1, R2, and R3 may be formed on the region M between the edge region E and the center region C. As also described above, the first redistribution pattern R1 and the third redistribution pattern R3 that are formed on the first through third semiconductor chips 100', 100" and 100''' may extend in the first direction X, and the second redistribution patterns R2 formed on the first semiconductor chip 100' may extend in the second direction Y in perpendicular to the first direction X.

Figure 6:
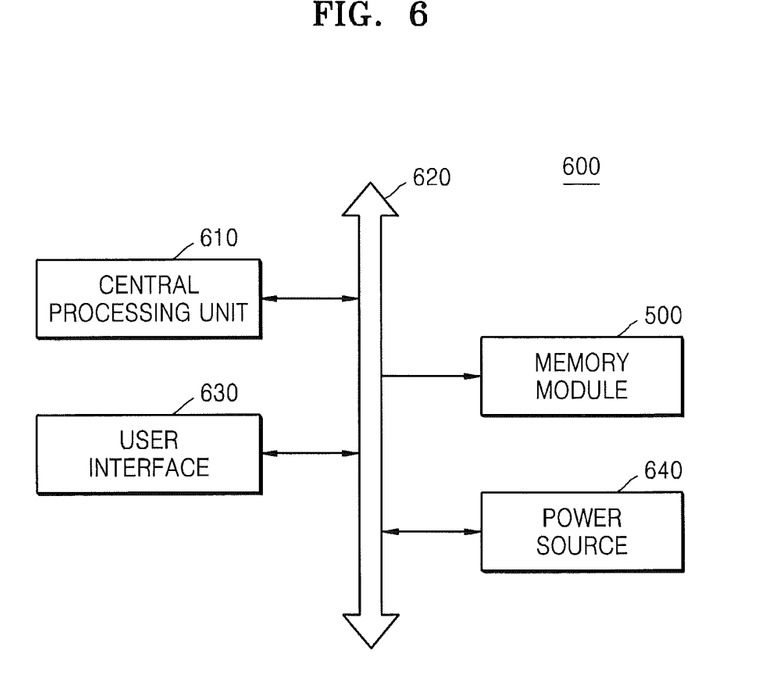
FIG. 6 is a block diagram of a computing system according to an example embodiment.

FIG. 6 is a block diagram of a computing system 600 according to an example embodiment. The computing system 600 of the present embodiment may include the memory module 500. Thus, a redundant description thereof will not be repeated here.

Referring to FIG. 6, the computing system 600 may include a central processing unit (CPU) 610, a user interface (UI) 630, a power source 640, and the memory module 500.

The memory module 500 is electrically connected to the CPU 610, the UI 630, and the power source 640 through a system bus 620. Data that is provided through the UI 630 or is processed through the CPU 610 is stored in the memory module 500. Although not shown, the computing system 600 may further include additional components including, for example, an application chipset, a camera image processor, etc.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor chip, comprising:
a plurality of memory cells;
at least one first center pad disposed on a center region of the semiconductor chip and connected to the plurality of memory cells;
at least one first edge pad disposed on an edge region of the semiconductor chip and connected to a first transmission line of a semiconductor module;
at least one second edge pad disposed on the edge region of the semiconductor chip and connected to a chipset voltage application unit of the semiconductor module;
at least one first redistribution pattern connected between the at least one first center pads and the at least one first edge pads;
at least one second redistribution pattern connected between the at least one first edge pads and the at least one second edge pads;
at least one second center pad disposed on the center region of the semiconductor chip and connected to the plurality of memory cells;
at least one third edge pad disposed on the edge region of the semiconductor chip and connected to a second transmission line; and
at least one third redistribution pattern connected between the at least one second center pad and the at least one third edge pad,
wherein an impedance of the at least one second redistribution pattern is impedance matched to an impedance of the first transmission line, and an impedance of the at least one third redistribution pattern is impedance matched to a difference between an impedance of the second transmission line and impedances from the at least one second center pad to the plurality of memory cells.

2. The semiconductor chip of claim 1, wherein the at least one second redistribution pattern is configured to perform a function of a parallel termination resistance that prevents a signal transmitted through the first transmission line from being reflected.

3. The semiconductor chip of claim 2, wherein the at least one first redistribution pattern extends in a first direction, and the at least one second redistribution pattern extends in a second direction perpendicular to the first direction.

4. The semiconductor chip of claim 2, wherein an impedance of the at least one second redistribution pattern is greater than an impedance of the at least one first redistribution pattern.

5. The semiconductor chip of claim 1, wherein the first transmission line is configured to transmit a command signal, an address signal, or a clock signal, and the second transmission line is configured to transmit a data signal.

6. The semiconductor chip of claim 1, wherein the at least one first redistribution pattern, the at least one second redistribution pattern, and the at least one third redistribution pattern are formed on a region between the edge region and the center region.

7. The semiconductor chip of claim 6, wherein at least one of the at least one first redistribution pattern, the at least one second redistribution pattern, and the at least one third redistribution pattern includes a meander member.

8. The semiconductor chip of claim 1, wherein at least one of the at least one second redistribution pattern and the at least one third redistribution pattern includes a plurality of redistribution patterns that are connected in parallel to each other, and
wherein the semiconductor chip further includes
a metal fuse connected to each of the at least one second redistribution pattern and the at least one third redistribution pattern.

9. The semiconductor chip of claim 8, wherein the metal fuse is in the form of a line, and includes a fuse blowing unit between both ends of the line,
wherein both ends of the lines include one or more impurity ions.

10. The semiconductor chip of claim 1, wherein the impedance of the at least one second redistribution pattern is greater than an impedance of the at least one third redistribution pattern.

11. The semiconductor chip of claim 10, wherein a length of the at least one second redistribution pattern is greater than a length of the at least one third redistribution pattern.

12. The semiconductor chip of claim 10, wherein a resistivity of the at least one second redistribution pattern is greater than a resistivity of the at least one third redistribution pattern.

13. A semiconductor module, comprising:
a plurality of semiconductor chips each including a plurality of memory cells;
a substrate on which the plurality of semiconductor chips are mounted;
a chipset voltage application unit mounted on the substrate;
a first transmission line formed on the substrate, the first transmission line being configured to transmit at least one of a command signal, an address signal, or a clock signal to each of the plurality of semiconductor chips; and
a plurality of second transmission lines formed on the substrate and configured to transmit a data signal to each of the plurality of semiconductor chips,
wherein at least one of the plurality of semiconductor chips includes
at least one first center pad disposed on a center region of the at least one semiconductor chip and connected to the plurality of memory cells;
at least one first edge pad disposed on an edge region of the at least one semiconductor chip and connected to a first transmission line of the semiconductor module;
at least one second edge pad disposed on the edge region of the semiconductor chip and connected to a chipset voltage application unit of the semiconductor module;
at least one first redistribution pattern connected between the at least one first center pad and the at least one first edge pad;

at least one second redistribution pattern connected between the at least one first edge pad and the at least one second edge pad;

at least one second center pad disposed on the center region of the at least one semiconductor chip and connected to the plurality of memory cells;

at least one third edge pad disposed on the edge region of the at least one semiconductor chip and connected to a second transmission line; and at least one third redistribution pattern connected between the at least one second center pad and the at least one third edge pad, wherein an impedance of the at least one third redistribution pattern is impedance matched to a difference between an impedance of the plurality of second transmissions lines and impedances from the second center pads of each of the plurality of semiconductor chips to the plurality of memory cells for each of the plurality of semiconductor chips.

14. The semiconductor module of claim 13, wherein the first transmission line comprises:

a first wire line configured to connect an external terminal of the substrate and the at least one first edge pad of the at least one semiconductor chip; and a plurality of second wire lines configured to connect the at least one first edge pads of each of the plurality of semiconductor chips, wherein the first wire line and the plurality of second wire lines have substantially same impedance, and the impedance of the plurality of second wire lines is impedance matched to an impedance of the first wire line.

15. The semiconductor module of claim 14, wherein the plurality of second transmission lines comprises a third wire line that connects the at least one third edge pads of each of the plurality of semiconductor chips and the external terminal of the substrate, and an impedance of the at least one third redistribution pattern is impedance matched to a difference between an impedance of the third wire line the impedances from the second center pads of each of the plurality of semiconductor chips to the plurality of memory cells for each of the plurality of semiconductor chips.

16. The semiconductor module of claim 14, wherein the at least one first redistribution pattern and the at least one third redistribution pattern extend in a first direction, and the at least one second redistribution pattern extend in a second direction perpendicular to the first direction.

* * * * *